US006809516B1

United States Patent
Li et al.

(10) Patent No.: US 6,809,516 B1
(45) Date of Patent: Oct. 26, 2004

(54) PASSIVE MAGNETIC FIELD SENSORS HAVING MAGNETOSTRICTIVE AND PIEZOELECTRIC MATERIALS

(75) Inventors: Yi-Qun Li, Orinda, CA (US); Robert C. O'Handley, Andover, MA (US); Gerald F. Dionne, Winchester, MA (US); Chun Zhang, Warren, NJ (US)

(73) Assignee: Spinix Corporation, Moraga, CA (US)

( * ) Notice: Subject to any disclaimer, the term of this patent is extended or adjusted under 35 U.S.C. 154(b) by 0 days.

(21) Appl. No.: 09/542,346

(22) Filed: Apr. 5, 2000

Related U.S. Application Data

(63) Continuation-in-part of application No. 09/441,763, filed on Nov. 17, 1999, now Pat. No. 6,279,406, which is a continuation of application No. 09/358,177, filed on Jul. 20, 1999.
(60) Provisional application No. 60/127,695, filed on Apr. 5, 1999.

(51) Int. Cl.[7] .............................................. G01R 33/00
(52) U.S. Cl. ........................................ 324/260; 324/244
(58) Field of Search .................................. 324/166, 173, 324/207.24, 207.26, 209, 117 R, 260, 174, 244, 207.25, 207.13; 73/861.77, 861.08; 310/311, 321, 364, 323.06; 33/355 R, 361

(56) References Cited

U.S. PATENT DOCUMENTS

| | | |
|---|---|---|
| 3,909,809 A | 9/1975 | Kinsner et al. |
| 4,499,515 A | 2/1985 | Piotrowski et al. |
| 4,528,502 A | 7/1985 | Rocha |
| 4,769,599 A | 9/1988 | Mermelstein ............... 324/244 |
| 4,887,032 A | 12/1989 | Hetrick |
| 4,936,508 A | 6/1990 | Ingalz |
| 5,130,654 A | 7/1992 | Mermelstein ............... 324/244 |
| 5,675,252 A | 10/1997 | Podney |
| 5,821,658 A | 10/1998 | Boggs, III |

FOREIGN PATENT DOCUMENTS

GB  2 188 157 A  9/1987

OTHER PUBLICATIONS

M.D. Mermelstein, "A Magnetoelastic Metallic Glass Low–Frequency Magnetometer," *IEEE Transactions on Magnetics*, vol. 28, No. 1 (Jan. 1992).
S.T. Vohra, et al., "Fiber–Optic DC and Low–Frequency Electric–Field Sensor," *Optics Letters*, vol. 16, No. 18 (Sep. 15, 1991).
M.D. Mermelstein, et al., "Low–Frequency Magnetic Field Detection with a Magnetostrictive Amorphous Metal Ribbon," *Appl. Phys. Lett.* 51(7) (Aug. 17, 1987).

*Primary Examiner*—Jay Patidar
(74) *Attorney, Agent, or Firm*—Hamilton, Brook, Smith & Reynolds, P.C.

(57) ABSTRACT

Passive solid-state magnetic sensors comprise a magnetostrictive material in contact with a piezoelectric material. The magnetostrictive material strains under the influence of an external magnetic field and imparts stress to the piezoelectric material to produce a detectable voltage signal indicative of the external field. Sensors have applications in rotor speed detection, electrical current measurements, magnetic imaging, magnetic field detection, read heads, and MRAM, for example.

7 Claims, 18 Drawing Sheets

ANTIPARALLEL POLARIZATION

PARALLEL POLARIZATION

OPEN LOOP

CLOSE LOOP

CHARGE AMP

FOLLOWER

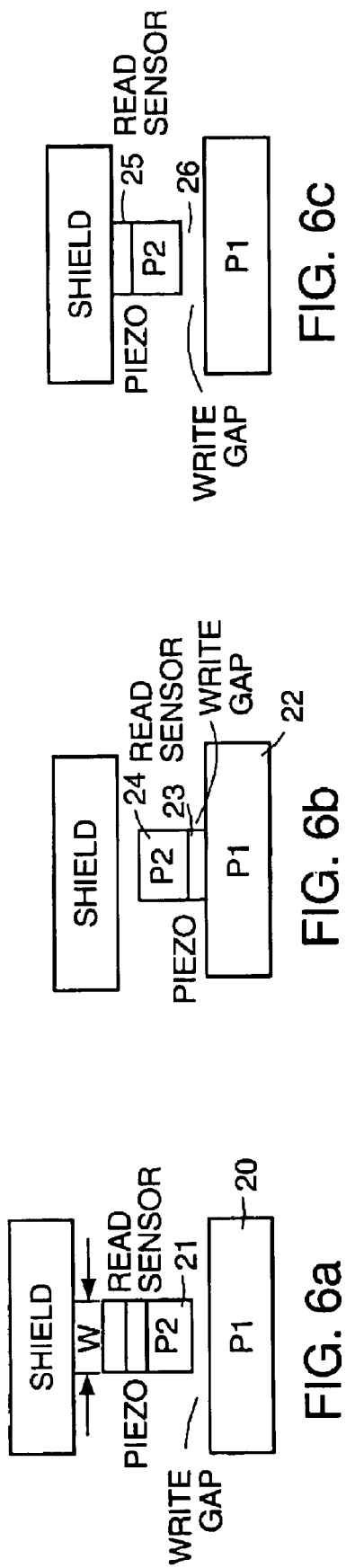
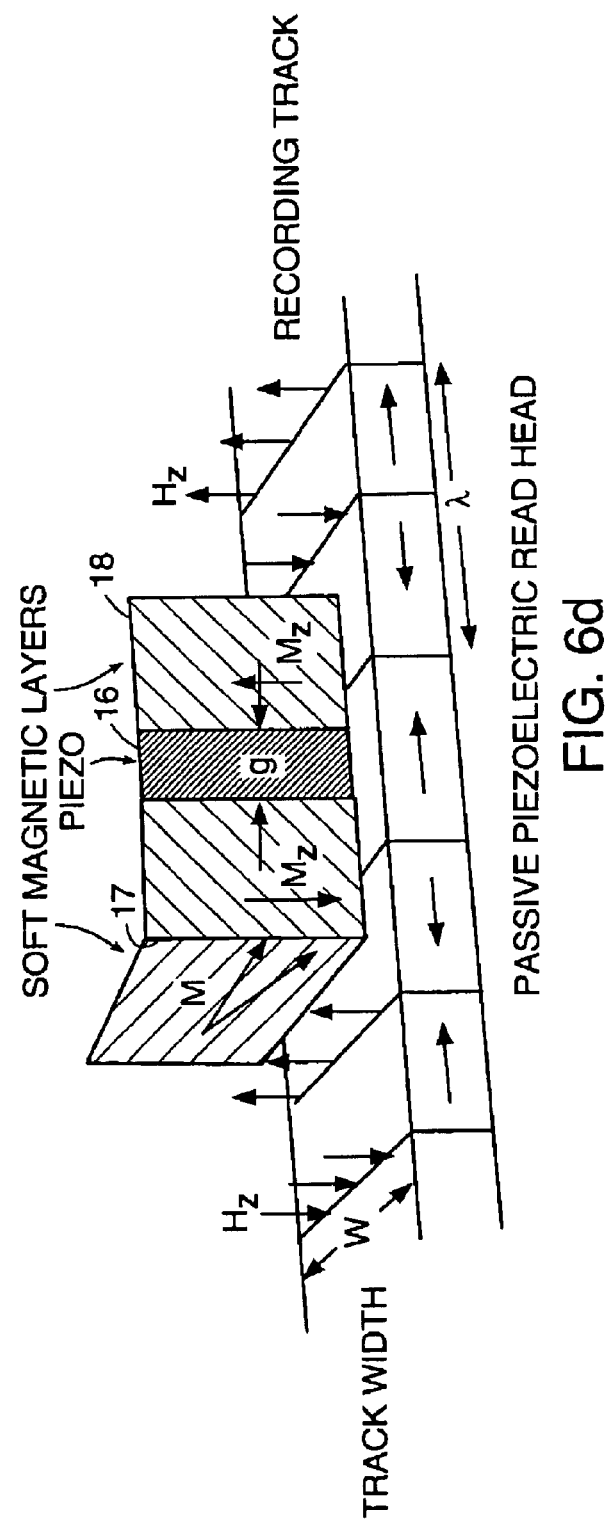

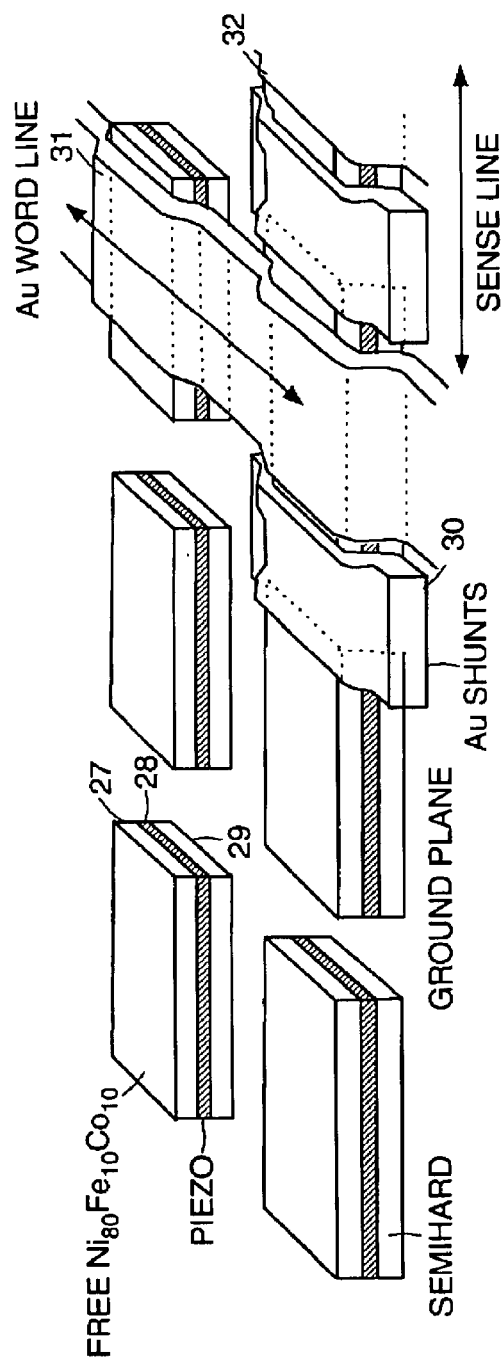
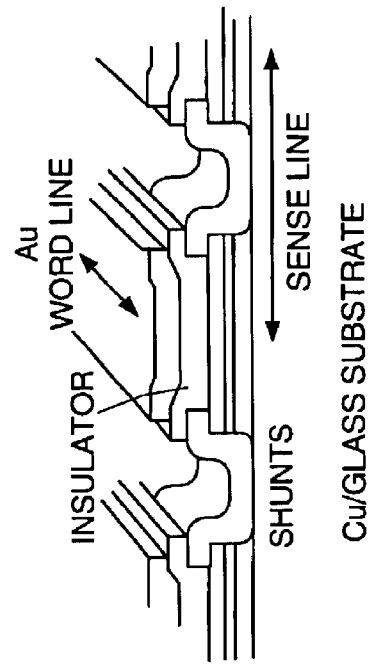
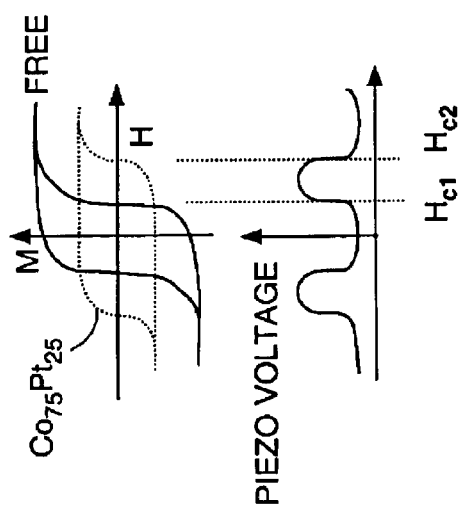
FIG. 7A
FIG. 7B
FIG. 7C

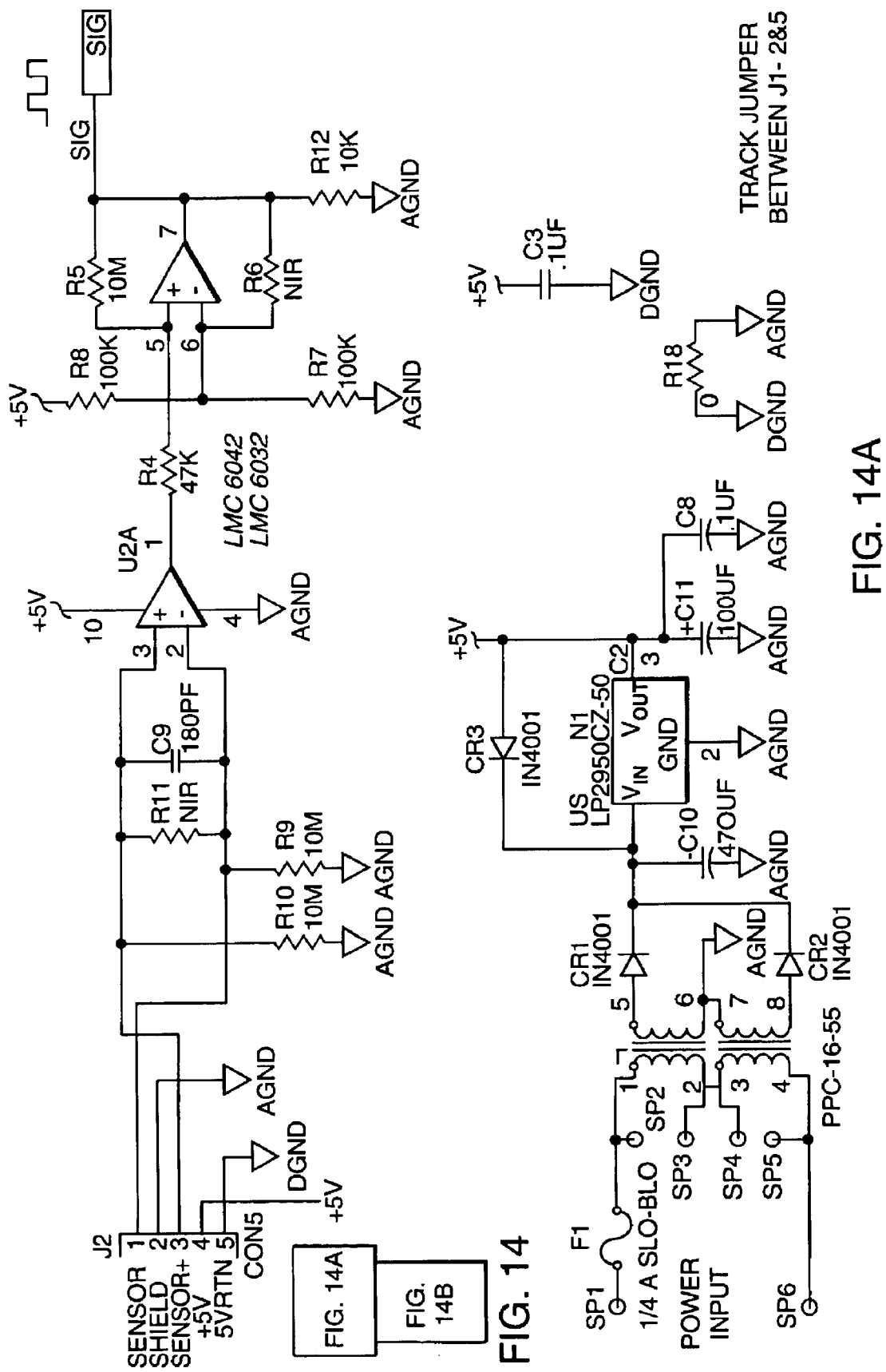

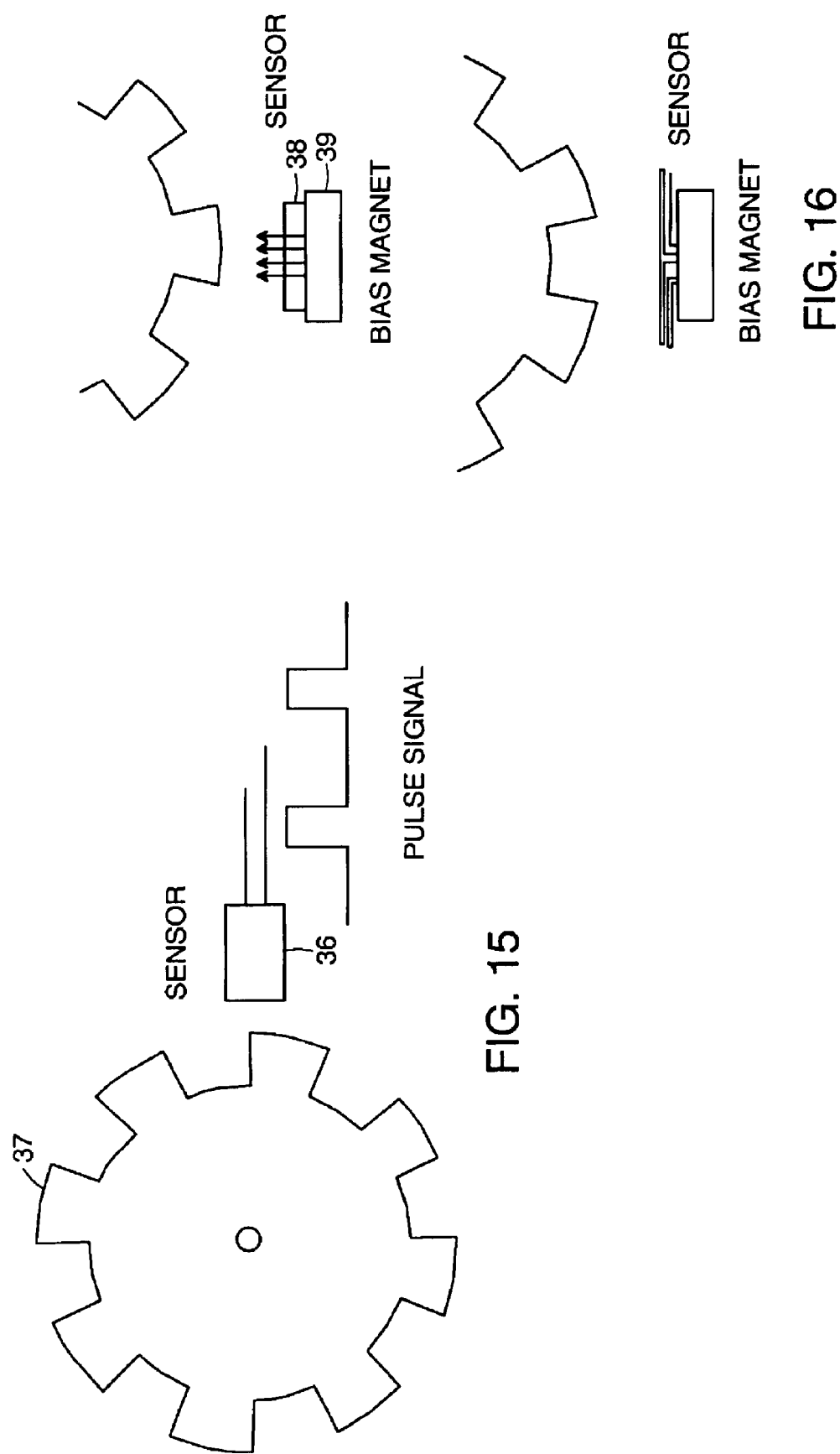

PASSIVE MAGNETIC FIELD SENSORS HAVING MAGNETOSTRICTIVE AND PIEZOELECTRIC MATERIALS

RELATED APPLICATIONS

This application is a Continuation-in-Part of U.S. application Ser. No. 09/441,763, filed Nov. 17, 1999, now U.S. Pat. No. 6,279,406, which is a Continuation application of U.S. application Ser. No. 09/358,177, filed Jul. 20, 1999, the entire teachings of each of these applications being incorporated herein by this reference This application also claims the benefit of Provisional Application No. 60/127,695, filed Apr. 5, 1999, the entire teachings of which are also incorporated herein by this reference.

BACKGROUND OF THE INVENTION

1. Technical Field

This invention is in the field of magnetic sensors which detect a magnetic field or magnetic field change and find use in linear or rotary motion detection, electrical current sensing, linear or rotary position sensing, magnetic imaging, magnetic recording read/write heads, magnetic recording media as well as general magnetic field sensing.

2. Background of the Invention

Because of the many applications of magnetic field sensors, there is a long history of technical development of materials and means to measure fields of various strengths. No one sensor can perform every function well. Factors such as size, weight, power consumption, and cost should be typically minimized by a field sensor. Sensitivity, linearity, bias, stability, reliability, and operating temperature and frequency range are factors that should be typically optimized. As with any instrument, it is usually difficult to achieve all of these characteristics in one device.

The most common magnetic sensors used in a variety of applications are the Hall effect sensor and the variable reluctance coil. The drawback of variable reluctance devices is that they generate signals proportional in size to the time rate of change of magnetic flux. The signal size therefore decreases with decreasing speed, and below a certain flux change rate, the signal disappears into the noise. Hall effect devices generate a very small raw signal because of low field sensitivities (0.5~5 mV/100 Oe applied field), and the device performance is strongly temperature dependent. These features mandate signal conditioning, and require that a certain minimum field be available for device operation.

The concept of combining the magnetostrictive materials and piezoelectric layers for highly sensitive magnetometer was first introduced by Mars D. Mermelstein in 1986. In his patents U.S. Pat. No. 4,769,599 and U.S. Pat. No. 5,130,654 a magnetometer was disclosed as a device using piezoelectric resonator to create a standing stress wave in the sensing magnetostrictive ribbon and using a pickup coil to read-out the electromotive force. A minimum detectable field gradient of 7.7 pT/cm Hz was achieved in this device by using a differential amplifier technique.

In U.S. Pat. No. 5,675,252, a device called piezomagnetometer was disclosed. In that device a stack of 201 alternating piezoelectric and magnetostrictive layers was used, in which 100 pairs of piezoelectric-magnetostrictive layer capacitors are connected electrically in parallel to increase the charge storage by raising the effective capacitor plate area. The device requires multiple layers that are placed in a permanent biasing magnetic field normal to the layer surface. The resolution as high as 1 pT/cm Hz was reported.

SUMMARY OF THE INVENTION

The present invention concerns passive solid-state magnetic sensors based on a combination of magnetostrictive material and piezoelectric material. The sensors can be mass produced at low cost in comparison with any existing magnetic sensor technologies including variable reluctance coils, Hall-effect devices, magnetoresistance semiconductors, and the most recently developed giant magnetoresistance (GMR) metal multilayers. Such a magnetostrictive/piezoelectric sensor need not consume any electrical power and with a field sensitivities larger than 10 mV/Oe being obtainable. Applications including digital speed sensor, digital flow sensor, and electrical current sensor have been demonstrated.

According to one aspect, the present invention concerns a device with (A) laminated structure, (B) planar structure, and (C) fiber composite structure. The laminated structure device is made by one piezoelectric layer sandwiched with two magnetostrictive layers or one magnetostrictive layer sandwiched with two piezoelectric layers.

The three-layer device is preferably connected electrically in series to increase the voltage by raising capacitor plate separation. The planar structure device is made by patterned piezoelectric strips on a magnetostrictive substrate. The fiber composite structure device is made by piezoelectric fibers surrounded by magnetostrictive materials. These sensors are designed for general magnetic field detection purposes in applications ranging from speed, flow, and electrical current detection to the information storage and imaging. The advantages of the inventive sensors over the competitive technologies are passive solid-state, high field sensitivity, wide dynamic range up to several thousands of Oersted, and low-cost in manufacturing.

Generally, the present invention uses a piece of piezoelectric material in contact with a magnetostrictive material. The magnetostrictive component strains in response to a magnetic field. This strain couples to the piezoelectric element causing it to produce an electrical output signal.

One important characteristic of embodiments of the invention is that the sensitivity of the device and the operating magnetic field range can be adjusted through material properties and structure designs for a variety of applications. The important variables used in the design include 1) selecting magnetostrictive materials with appropriate properties, 2) selecting piezoelectric materials with optimal properties, 3) determining the optimal number of capacitive elements, 4) selecting the appropriate size of both magnetostrictive and piezoelectric elements, 5) designing the geometry of the structure, and 6) establishing the most efficient bonding and packaging methods. The inventive magnetic sensors can be widely used in replacement of Hall-effect sensors, variable reluctance coils, and magnetoresistive devices. The particular applications of the inventive magnetic sensors are (a) speed detection and controls for rotary machines including automobiles, airplanes, locomotives, etc., (b) flow meters for reading and controls of liquid or gas flows, (c) electrical current meters for reading and controls of electrical power usage, and (d) micromagnetic field sensors for magnetic recording/reading heads, magnetic recording media and magnetic imaging devices.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIGS. 6a, 6b, 6c, 6d are schematics showing a piezoelectric magnetic read/write head according to the invention.

FIGS. 7a–7c show a passive piezoelectric magnetic random access memory (P-MRAM) including a simplified view of trilayer magnetic/piezo/magnetic elements at left and conductors at right; the passive voltage measured across the device in FIG. 7b; and a cross section of the main elements of the device in FIG. 7c, according to the invention.

FIGS. 14a and 14b are schematics of a microprocessor-based electrical circuit design for the passive solid-state magnetic sensors used in the motion detection according to the invention.

FIG. 15 is a schematic of a conventional Gear-Tooth method for generating pulse signals in magnetic sensors according to the invention.

FIG. 16 includes schematics of the principles of the passive magnetic sensor used in a conventional Gear-Tooth method for speed detection according to the invention.

DETAILED DESCRIPTION OF THE INVENTION

We have discovered an efficient way to incorporate a magnetostrictive material with a piezoelectric material to produce a magnetic field sensor and designed a suitable electrical circuit for impedance matching and signal amplifying. The principle of such a sensor is that a strain is induced in a magnetostrictive element when it is exposed to a magnetic field sufficient to change the direction of magnetization. This magnetostriction strain is then transferred into the adjacent piezoelectric element to which it is bonded. The piezoelectric element, in turn, produces an electrical signal output.

A. Laminate Structure Design

Figure 1A:
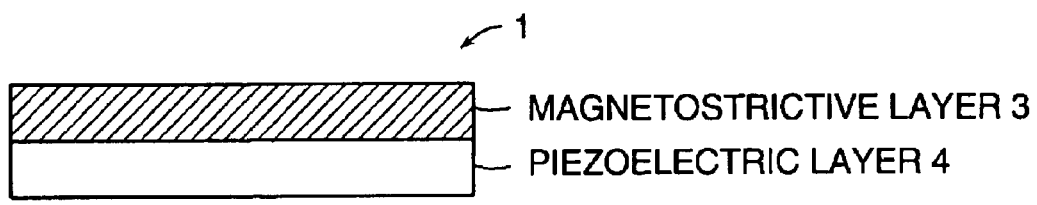
FIGS. 1a–1c are schematic cross-sectional drawings illustrating the basic structures of the solid state magnetic sensors according to the invention.
Figure 1B:
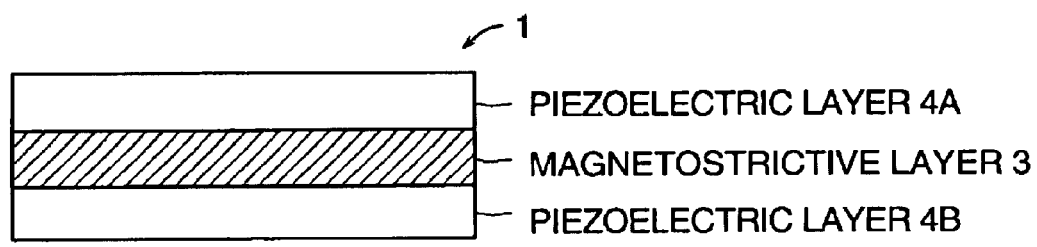
Figure 1C:
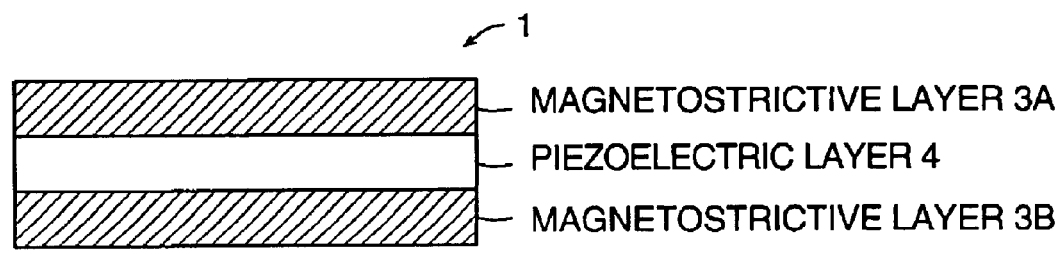

FIGS. 1a–1c illustrate embodiments of the magnetic sensor 1. The structure of FIG. 1A is a basic two-layer sensor containing one piezoelectric layer 4 and one magnetostrictive layer 3. Structure of FIG. 1b is comprised of two structure-A sensors; here the magnetostrictive layer 3 will strain simultaneously on both sides of piezoelectric layers 4A, 4B. Structure of FIG. 1c is also comprised of two structure-A sensors; here the two magnetostrictive layers 3A, 3B will strain simultaneously on both sides of a piezoelectric layer 4. The thickness of individual element and the total number of elements comprising the structure is optimized depending on the application.

Structure of FIG. 1c is preferred for most of the applications since this structure is more rugged and more cost effective. In these structures, the electrical signal is produced by the strain generated at the interfaces of magnetostrictive and piezoelectric layers by a magnetic field without involving the bending of the structure, which provides a good mechanical stability. By expanding the separation for high voltage and reducing surface areas, multiple sensors can be readily connected in planar geometry. This concept is particularly appreciated if the magnetostrictive element is an insulator e.g., a ferrite.

Figure 2:
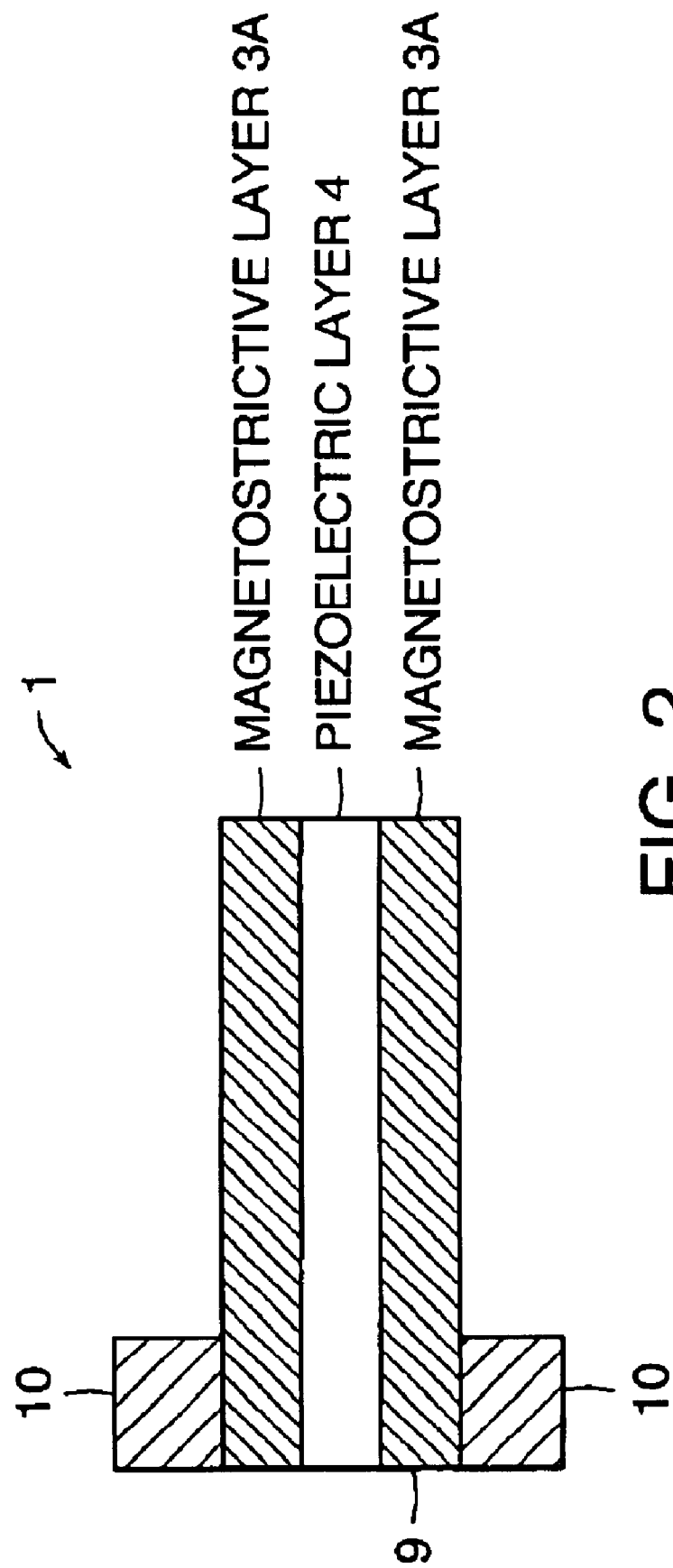
FIG. 2 is a schematic of the cantilever configuration/structure of the passive solid state magnetic sensor according to the invention.

The use of cantilevers is a common method of amplifying mechanical motion to enhance the strain induced in a piezoelectric or magnetostrictive material. This is shown in FIG. 2. In this case a bimorph sensor structure 1 of one piezoelectric layer 4 with two magnetostrictive layers 3A, 3B is used. Alternatively, two piezoelectric layers with one magnetostrictive layer in the middle is preferred and the two piezoelectric layers are poled in orthogonal directions so that the stresses in the two piezoelectric layers due to bending are in opposite directions. The cantilever is achieved by mounting one end 9 with a bracket 10 and letting the other end to move freely. Although this cantilever design produces a larger signal, the structure of FIG. 1c is found to have sufficient sensitivity for most of the applications.

A soft magnetic material is one in which the direction of magnetization M is readily changed by a modest applied field (H<100 Oe). The simplest effect that governs the orientation of magnetization in a soft magnetic material in the absence of an external field is sample shape. The magnetization vector chooses an orientation, which minimizes the number of magnetic poles appearing on the sample surface. Thus M prefers to lie along the longest sample dimension and avoid orientations normal to the largest area surfaces. This magnetostatic effect can be used to advantage to design a sensor with a preferred quiescent state of magnetization. Thus a piece of soft magnetic material in ribbon, sheet or thin film form will be magnetized in the longer of the in-plane directions. A field transverse to this quiescent state will cause a rotation of the magnetization into the field direction. A 90° rotation of the magnetization causes the largest shape change in a magnetostrictive material. A field applied along the preferred axis of magnetization will produce only 180° domain wall motion which does not change the state of strain of the magnetic material. Therefore, from the view of minimizing the demagnetizing field (increasing the effective magnetic field) in the sensor, the sensor is preferred to be oriented with the longer side parallel to the sensing magnetic field, and from the view of maximizing the magnetostriction in the sensor, the sensor is preferred to be placed with the short side parallel to the sensing magnetic field. The trade off has to be made when the sensor is designed.

The preferred direction of magnetization can also be controlled by magnetic field annealing. Annealing is preferably performed in a field of 100 Oe min. at temperatures below the Curie temperature of the magnetic materials. The annealing temperature and time, alloy composition and $T_c$, cooling rate, and the strength of the field all affect the results obtained. The bias magnetic field can be also applied in certain direction to optimize the design.

Two factors have to be considered for selecting piezoelectric materials. The piezoelectric voltage constant g (Vm/N) determines the sensitivity of generating electrical voltage at a certain force or stress. The temperature coefficient of the g constant determines the operation range of the sensors. Two material candidates which possess high g constant are lead zirconate titanate ($PZT=Pb(Zr_xTi_{1-x})O_3$) ceramics and PVDF (polyvinylidene fluoride) polarized polymers, and applicable to the sensors 1. The former has g constants of 10 to 50 and a high electromechanical coupling coefficients K of 0.3 to 0.7. The later has a high g constant of 200 to 300 but low electromechanical coefficient of 0.1 to 0.15. The major difference between these two materials are their dielectric constants. The PZT ceramics have relative dielectric constant $\in/\in_0$ that is 100 times larger than the PVDF polymer. Since the figure of merit for the inventive sensor is proportional to $gK/\in$, the PVDF polymer has much higher value of figure merit than PZT. The temperature stability of the PVDF, however, is much worse than PZT ceramics. The other piezoelectric material such as aluminum nitride (AlN) and quartz ($SiO_2$) having similar figure of the merit to PZT can also be used for the inventive sensors. These two materials are a better choice for multilayer thin film sensors because of their deposition compatibility with the magnetostrictive metals.

The two major requirements on the magnetic material are:
1. A non-zero magnetostriction so that it strains upon being magnetized.
2. An anisotropy that allows the material to be saturated in a field of strength governed by the range of fields to be measured. This involves both the hysteresis properties of the material and its saturation magnetization value which influences anisotropy, depending on shape of the material and direction of the magnetizing field.

For measuring very weak fields, a figure of merit is the ratio $Q=E\lambda_s^2/2Ku$ Q is maximized when the material gives the most strain in the weakest fields. Amorphous magnetic alloys can be field annealed to be greatest magnetized to saturation in fields below 10 Oe. In a material such as a—FeBSi ($\lambda_s$~35×10$^{-6}$, $M_s$~1400 emu/$g_1^v$), E~10$^{12}$ d/cm$^2$, $K_u=M_sH_a/2$~7×10$^3$ erg/cm$^3$, so Q~0.18. For a highly magnetostrictive material such as Terfenol-D, E~5×10$^{11}$ d/cm$^3$, $\lambda_s$=1750_×10$^{-6}$, $M_s$~800 emu/cm$^3$, $K_a$~1–4×10$^5$ erg/cm$^3$. Thus

Q~0.01 which is lower than that for the lower $\lambda_s$ material. However, Terfenol-D will be suitable for measuring larger field strengths.

Nickel and many iron-nickel alloys are good choices because both anisotropy and magnetostriction can be controlled over reasonably wide ranges. However, amorphous magnetic alloys remain the best choice for low field measurements because very low magnetic anisotropy can be achieved. Iron-cobalt alloy has a relative large magnetostriction and high saturation field. The magnetostriction of the annealed $Fe_{50}Co_{50}$ alloy can reach 150×10$^{-6}$ and the maximum $d\lambda/dH$ can be as high as 2×10$^{-6}$ per Ostered in comparison with 4×10$^{-6}$ for FeSiB amorphous ribbon and 0.04×10$^{-6}$ for Ni. The advantage of using FeCo alloy is that the linear range and the sensitivity of magnetostriction verses a magnetic field can be controlled by the compositions and annealing processes to meet a variety of applications.

B. Planar Structure Design with Magnetostrictive Substrate

An alternative device structure is based on the use of a magnetostrictive insulator (ferrite). In combination with a piezoelectric, the ferrite provides an efficient two-layer planar structure that lends itself to thin film processing and has the advantage of a high length to area ratio to give a small capacitance that permits high-frequency operation.

Figure 3A:
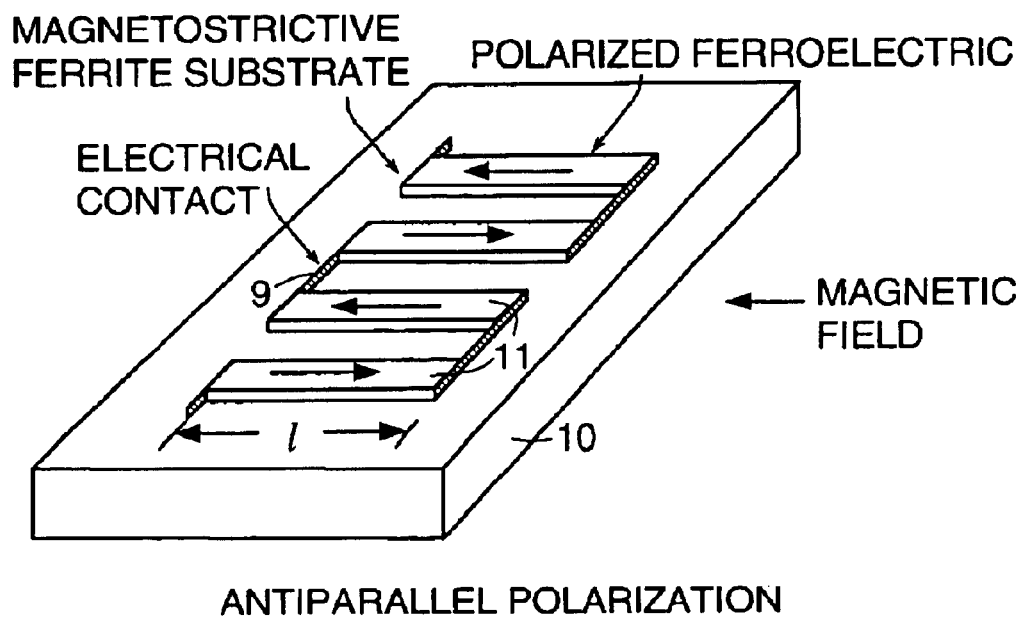
FIGS. 3a and 3b are schematic perspective drawings of planar piezoelectric design with magnetostrictive ferrite substrate according to the invention.
Figure 3B:
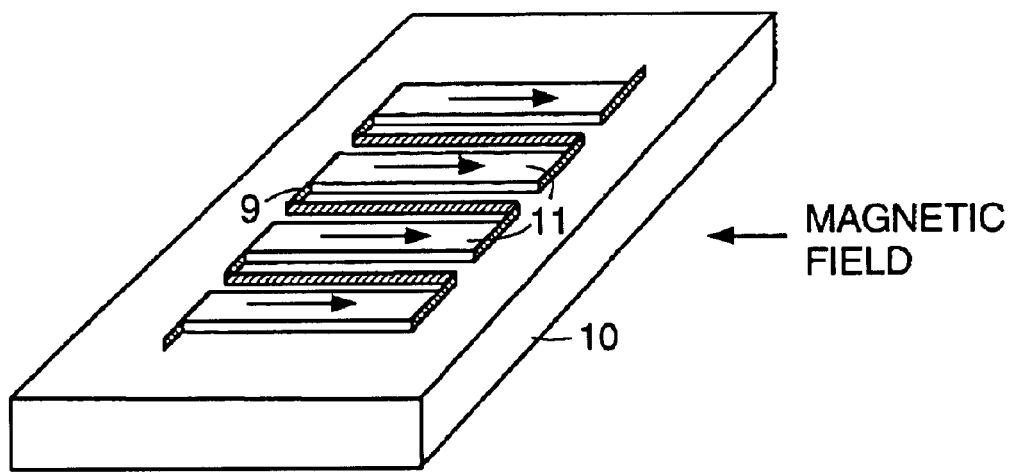

In FIGS. 3a and 3b, a ferromagnetic material with magnetostrictive properties acts as a substrate 10 for a pattern of parallel piezoelectric stripes 11 of length 1. As indicated, the piezoelectric stripes are electrically polarized (poled) into a ferroelectric state with an initial dielectric displacement bias, and are connected in series by conductive, metalizations or electric contacts 9 such that the polarization directions are continuously reinforcing.

FIG. 3a depicts the case of alternating pole directions and a simple connector 9 scheme.

The arrangement in FIG. 3b is more complicated in that the conductors 9 must be longer but offers the processing advantage of allowing the ferroelectric poling step to be delayed until after the device structure is completed.

One important benefit of ferrites is their high initial permeability and narrow hysteresis loop, which avoids the necessity of an external bias magnet. Although the magnetostriction constants are more than a factor of ten smaller than metallic materials such a terfenol-D, ferrites such as NiZn spinel ferrite can have initial permeabilities more than a factor of one hundred greater. $CoFe_2O_4$ ferrites has a magnetostriction as high as $200 \times 10^{-6}$. The effect of these magnetic parameters on piezomagnetic device performance can be deduced from the following relation for voltage sensitivity to magnetic field (which is analogous to the Q figure of merit):

$$dV/dH=(d/\in)(\lambda_s/H_k)cl \cos \theta, \quad dV/dH=(d/,)(8s/HK)cl \cos 2,$$

where c is Young's modulus. The key design parameter for the ferrite is the ratio of saturation magnetostriction constant $\lambda_s$ to the magnetocrystalline anisotropy field $H_K$. In most ferrites, $H_K$ can be effectively canceled by cobalt additions. The key design parameter of the piezoelectric layer is the ratio of the relevant piezoelectric constant d to the corresponding dielectric permittivity ∈. The key device design parameter for maximum voltage is the length l of the polarized stripe. All of these design parameters must be maximized for optimum sensitivity.

One further advantage of this planar device configuration is the large dynamic range of magnetic field sensing that is achieved simply by adjusting the angle θ between the magnetic field vector and the plane of the ferrite substrate. With hysteresis switching times of ferrites in the nanosecond range and the low capacitance resulting from small length to area ratios, application of these devices can be extended to the high-frequency sensing regime.

C. Fiber Composite Structure Design

Figure 4A:
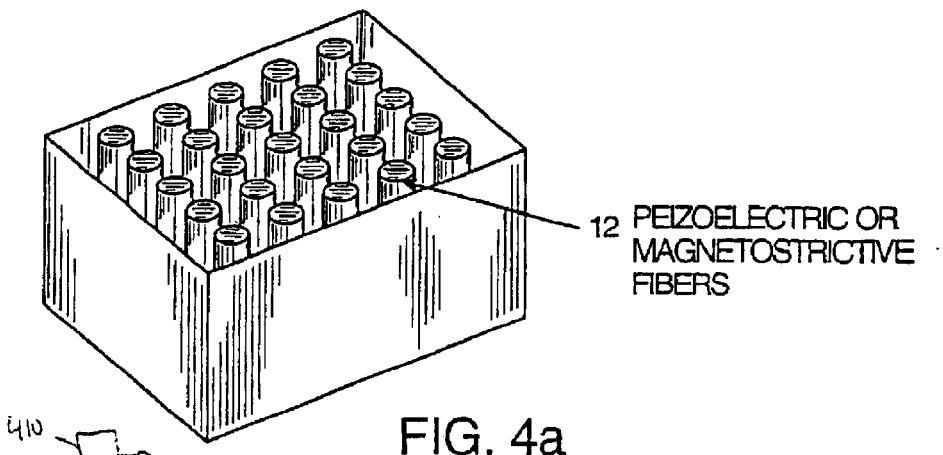
FIG. 4a is a perspective view showing ceramic fibers 12 made by injection molding.
Figure 4B:
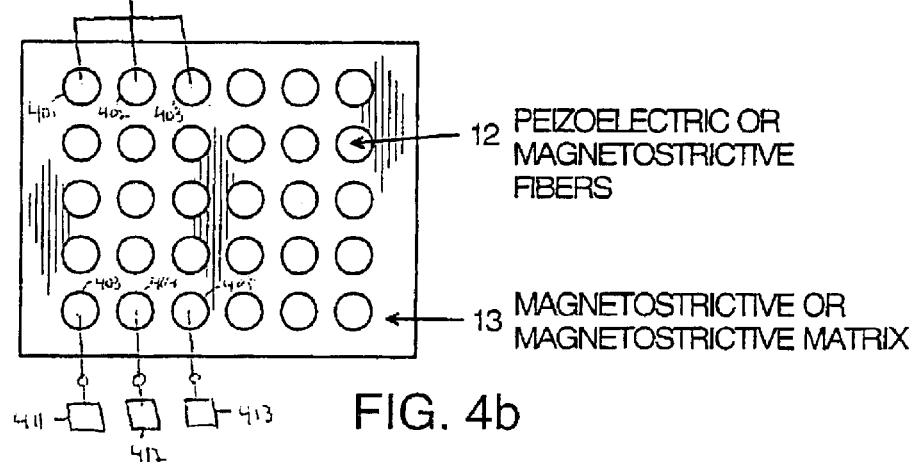
FIG. 4b is a top view after packing with magnetostrictive material.
Figure 4C:
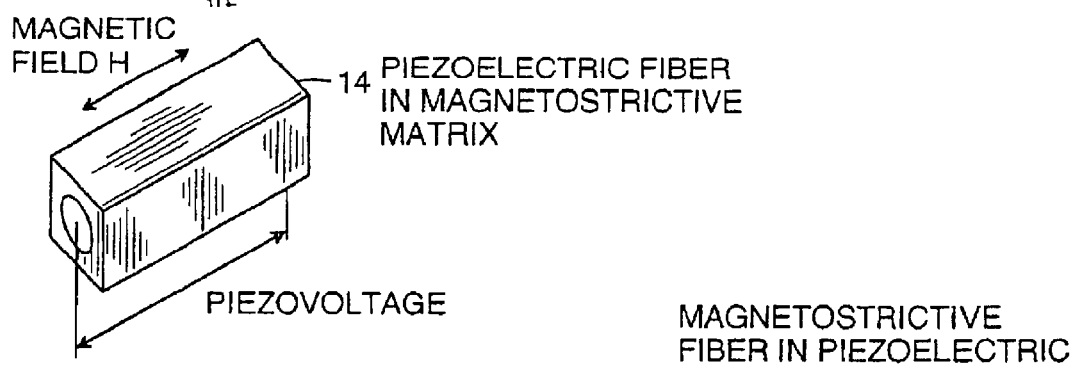
FIG. 4c is a perspective view of a single piezoelectrical fiber sensor.

Another approach to fabricate a magnetic sensor utilizing the combination of magnetostrictive and piezoelectric materials is to start with piezoelectric, for example PZT ceramic fibers 12 made by injection molding as shown in FIG. 4a, and then to pack magnetostrictive material powders such as nickel or cobalt ferrites and magnetostrictive metal alloys or intermetallic compounds. The final process is to sinter the packed sample at proper elevated temperature. The top view of a final sample with array of piezoelectric fibers 12 surrounded by magnetostrictive materials 13 is shown in FIG. 4b. The sample can be used as a whole piece for large area sensors by connecting piezoelectrical fibers in parallel or as sensor array devices by addressing and reading out the piezoelectric fiber individually. By way of example. FIG. 4b illustrates a first set of piezoelectric rods or fibers 401, 402, 403 connected electrically in parallel to read-out circuit 410. A second sed of rods or fibers 403, 404, 405 is independently addressed and read out by read-out circuits 411, 412, 413. The array can also be sliced into individual sensors 14 as shown in FIG. 4c. The electrodes are made by metallizing the top and bottom of piezoelectric fibers.

Figure 4D:
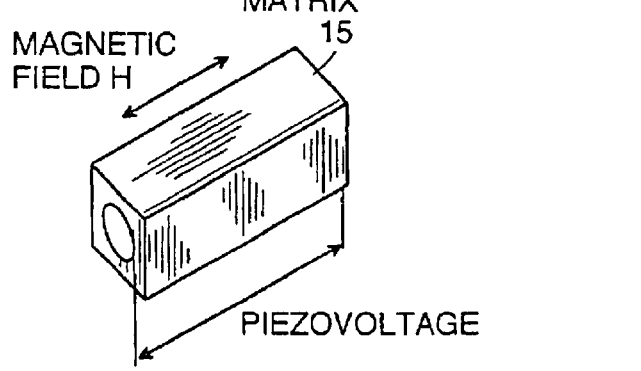
FIG. 4d is a perspective view of a single magnetostrictive fiber sensor.

In the same way using magnetostrictive fibers 12 in piezoelectric matrix 13 can also serve the same purpose of making the magnetic sensor elements as discussed above. A sensor with a magnetostrictive fiber in the middle 15 as shown in FIG. 4d has a better magnetic field sensitivity since it is easier to be magnetized along the fiber. The advantages of such a fiber approach in comparison with the previously described multilayer approach are:

(1) Sensor performance can be improved by (a) increased interface area between piezoelectric and magnetostrictive materials, (b) twice large piezoelectric voltage constant $g_{33}$ (electric field is parallel to the applied stress) to $g_{31}$, used for the multilayer structure, and (c) increased lengths of piezoelectric fibers and thus reduced capacitance of each piezoelectric fiber, which increases the produced voltage and operating frequency.

(2) Sensor structure is more reliable and durable since piezoelectric and magnetostrictive materials is bounded by sintering instead of adhesives, and the cylindrical interface can withstand more shear stress than the laminated multilayer structure.

D. Sensor Circuit and Applications

The principle of the generation of the electrical signal from the innovative sensor is based on the piezoelectric effect of ferroelectric materials or electrostrictive effect of general dielectric materials. The sensor structure can be treated electrically equivalent to a voltage source in series with a capacitor or a charge generator (current source) in parallel with a capacitor.

FIGS. 5a–5d shows four basic circuit approaches for amplifying and reading the signal output from the sensors.

Figure 5A:
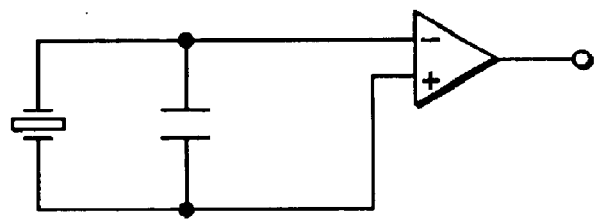
FIGS. 5a–5d are circuit diagrams for an open-loop circuit design for direct measurement of voltage generated by a piezoelectric magnetic sensor; a closed-loop circuit design for measurement of the charge change produced by a piezoelectric magnetic sensor, a charge amplifier, and a unit-gain follower design for high impedance matching, according to the invention.
Figure 5B:
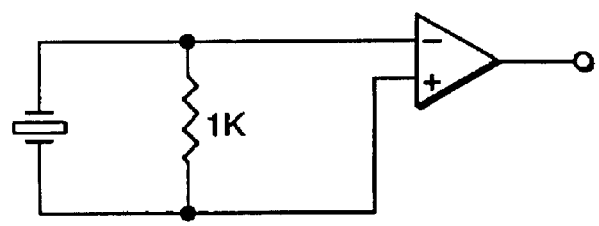
Figure 5C:
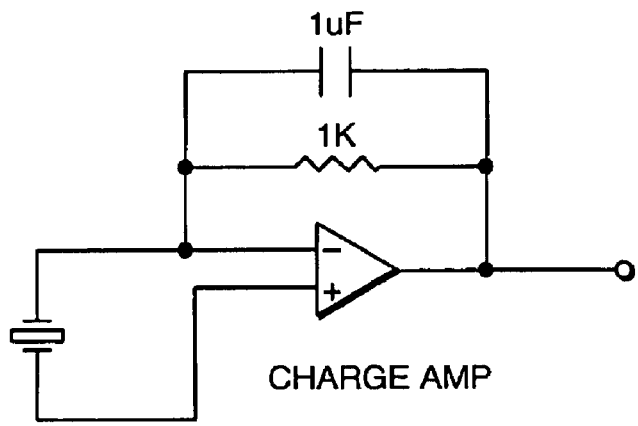
Figure 5D:
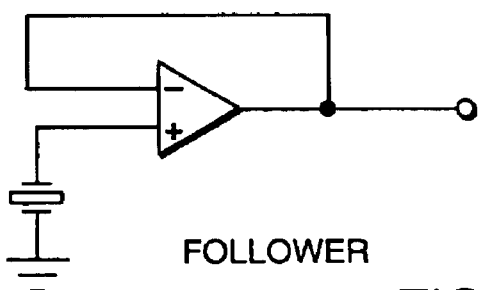

In the case of FIG. 5a the change in the sensor is directly measured as an open loop voltage by an operational amplifier with a high impedance and a low leakage current. In the case of FIGS. 5b and 5c the charge change in the sensor is measured as a current passing through a resistor in a closed loop circuit. In the case of FIG. 5d the high impedance signal from the sensor is converted to a low impedance signal by a follower with unit gain circuit design.

Circuit of FIGS. 5a and 5d are preferred for the inventive sensors because the cut-off frequency (3 dB down) can be as low as $8 \times 10^{-5}$ Hz with 2 nF of sensor capacitance and 0.08 Hz with 2 pF of sensor capacitance if the input resistance of the operational amplifier and the sensor internal resistance are in a order of $10^{12}$'E. More importantly, the measured voltage with this circuit is independent of the area of the sensor, which allows a sensor with a miniature size, for example, for magnetic imaging and magnetic recording read heads. A unit gain follower with a picoamper electrometer amplifier AD546 (impedance as high as $10^{12}$'E) was built to test sensors made from FeCo/PZT/FeCo three-layer structure. Frequency independence of the signal output after the cutoff frequency is confirmed in a sensor with a size of $2 \times 10$ mm² and a capacitance of 2 nF. The independence on area of the signal output is confirmed with a $2 \times 10$ mm² sensor and a $1 \times 5$ mm² sensor. The ratio of sensor width to sensor length was maintained the same to eliminate the difference of diamagnetizing effect. The other characteristics of the circuit of FIG. 5a to measure the output of the sensor is that the output voltage is theoretically proportional to the thickness of the piezoelectric materials in this layered configuration, which has also been demonstrated by a comparison of two sensors made from different thickness of PZT plates, one is 200 μm and the other is 500 μm thick, the later shows the signal output twice larger than the former.

The thin-film devices based on a laminate structure alternating with magnetostrictive layer and piezoelectric layer are important for reducing the sensor size and integrating with semiconductor IC circuits. Two potential applications are outlined as the following.

A trilayer structure as shown in FIG. 1 can be used to read the stored information on the recording media. The thickness of the devices can be designed as small as 300 Å to meet the requirement for the rapidly growing density of recording media. The advantage of these devices over the currently used MR or GMR technology includes high sensitivity, high thermal stability, and no requirement for input power.

ED FIG. 6d shows the film structure having a central piezoelectric layer 16 sandwiched by two soft magnetic layers 17, 18 of non zero-magnetostriction. The soft layers are processed (by field annealing or intrinsic stress from substrate) so that they are magnetized essentially parallel to the track width W of the underlying bits. The thickness of the piezoelectric layer forms the read head gap, g, and must be less than about half a bit length: $g<\lambda/2$.

When the head is over a dibit ($\pm H_z$ separated by $\lambda/2$) the magnetization of one pole piece 17 is tilted down from the horizontal and the other 18 up. The magnetization change in the two layers results in a change in the state of strain of the piezoelectric layer 16 and a voltage is induced in it. The induced voltage is read directly across the two metallic pole pieces. It does not matter whether the magnetization vectors in the two pole pieces are parallel or antiparallel to each other (the latter is more stable magnetostatically). In either case, the field above the recorded transition will result in a characteristic voltage across the piezoelectric layer. This voltage signal will differ in the parallel and antiparallel cases. The two pole pieces of the head can be set to one or the other state, whichever is optimal for the selected piezoelectric material and the characteristics of the recording medium. The ideal magnetic layer composition will have a weak cross track anisotropy and non-zero magnetostriction (e.g. $Ni_{76}Fe_{24}$ or $Fe_{50}Co_{50}$). The coercivity of these layers should be minimal.

It is also possible to integrate the write head into this read head structure by making one of the read pole pieces of a high flux density material ($Fe_{50}Co_{50}$). The piezoelectric layer will still be strained to produce a voltage during the read process. The read/write head must be shielded and one of the shields provides a low reluctance return path for the write process. Three possible constructions for read heads that are integrated with an inductive write head are shown in FIGS. 6a–6c. The view in each case is of the "air bearing surface", i.e. the end of the recording head looking up from the medium along the z direction. In all cases, the piezoelectric layer thickness defines the read gap, g. The insulation between the shields and the other metallic layers is typically alumina.

In configuration of FIG. 6a, the read sensor is fabricated between two much thicker shield layers. The lower shield 20 serves as a return flux path for the write process, P1. The bits are written across the write gap, with one of the read pole pieces being of a high flux density material and also serving as the other write pole piece, P2 21. The track width, w, is defined by P2. In configuration of FIG. 6b, the lower shield 22 serves as both P1 and one of the read pole pieces. Thus the read and write gaps are both defined by the thickness of the piezoelectric layer 23. Again P2 24 defines the track width. In configuration of FIG. 6c, the read gap 25 and write gaps 26 are again separated.

It is possible also to make use of the benefits of passive piezoelectric sensing of different magnetic states in MRAM-like devices for nonvolatile information storage. We describe one embodiment here.

While spin-valve based MRAM has many advantages, it does draw current and the signal is proportional to the sense current. It may also by frequency limited by eddy current losses in the leads and switching times in the magnetic layers. Similar to a non-volatile spin valve MRAM, a writable memory cell invention here is a trilayer of soft-magnetic 27/piezoelectric 28/semihard magnetic 29 films which no need for a sense current as shown in FIG. 7b. When the state of magnetization is the same in the two magnetic layers, the piezoelectric layer will be in one state of strain (depending on the magnetostriction and thickness of the two adjacent layers). When the state of magnetization is different in the two magnetic layers, the piezoelectric layer will be in a different state of strain. These different states of strain will be reflected in the voltage across the piezoelectric layer which we have demonstrated to be appreciable and readily measured.

The information is written and stored in the semihard layer 29. The readout is done by sensing the piezoelectric voltage across the trilayer in two states of magnetization for the soft or free layer 27. Because the soft and semihard layers have different coercivities, the piezoelectric voltage changes as a function of field as shown in FIG. 7b. Fields greater than $H_{c2}$ are required to write information (one of two stable states of magnetization) in the semihard layer. A field of magnitude between $H_{c1}$ and $H_{c2}$ changes the state of magnetization in the free layer without altering the written bit. When the free layer magnetization is changed, the sense of the voltage change across the device indicates the state of magnetization in the storage layer. The fields are applied with a cross pattern of conductors that also leave to locate the address of each bit. This piezovoltage is read at the x-y address of the bit as in a spin-valve MRAM but there is no need to power the device by putting a current through it. There are significant advantages to this piezoelectric-MRAM (P-MRAM) in terms of speed, signal-to-noise ratio, and power consumption relative to all metal MRAM. In addition, it may also add to the lifetime and reliability of the devices because issues of metallic interdiffsion across two metallic interfaces are obviated by the presence of a stable oxide material. A variety of other soft and semihard magnetic materials which have significant magnetostriction could be used instead of the ones illustrated in the figure above. In addition, there are a great many piezoelectric materials that can be chosen based on material compatibility, signal to noise, reliability and so on. The shunts 30, word lines 31 and sense lines 32 can also be made of conductors other than Au.

Figure 8:
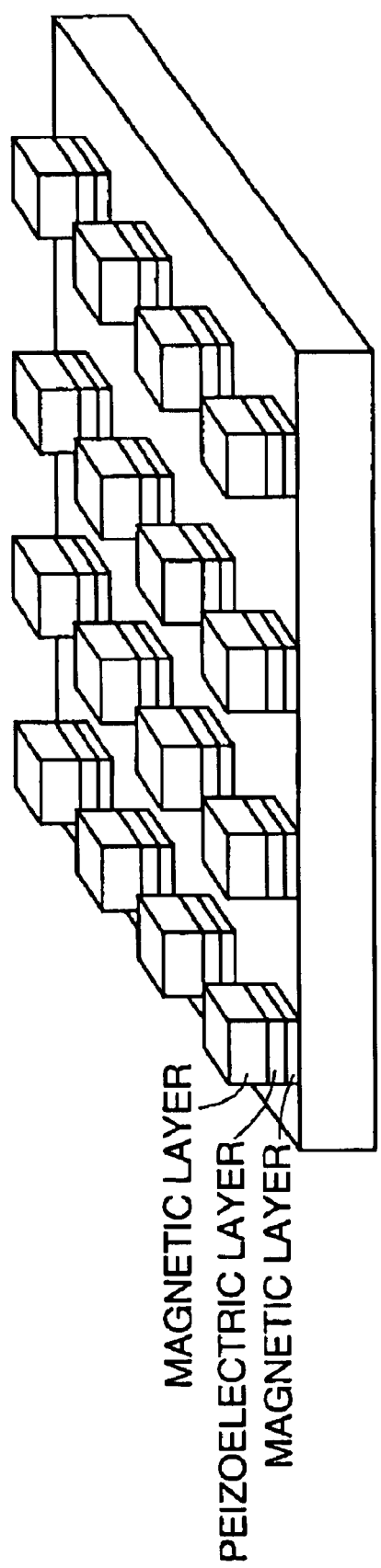
FIG. 8 is a schematic of two dimensional piezoelectric magnetic sensor array for magnetic imaging according to the invention.

Two dimensional, as schematically shown in FIG. 8 or one dimensional multilayer or fiber composite sensor arrays can be made by dicing the composite sheet or patterned by photolithographic methods. A pixel element can be individually addressed and read out with the similar electronics developed for ultrasonic imaging and pyroelectric IR imaging. The readout circuit will be directly integrated with the magnetic sensor array on a semiconductor wafer for detection of the electric charge change in piezoelectric layer caused by a magnetic field change through magnetostrictive layer. Such a device will be useful for many nondestructive inspection applications including integrated circuits, construction objects, recording disks, medical imaging, for mine searching, anomalous detection, and possibly for high speed recording read head array.

EXAMPLE 1

Figure 9:
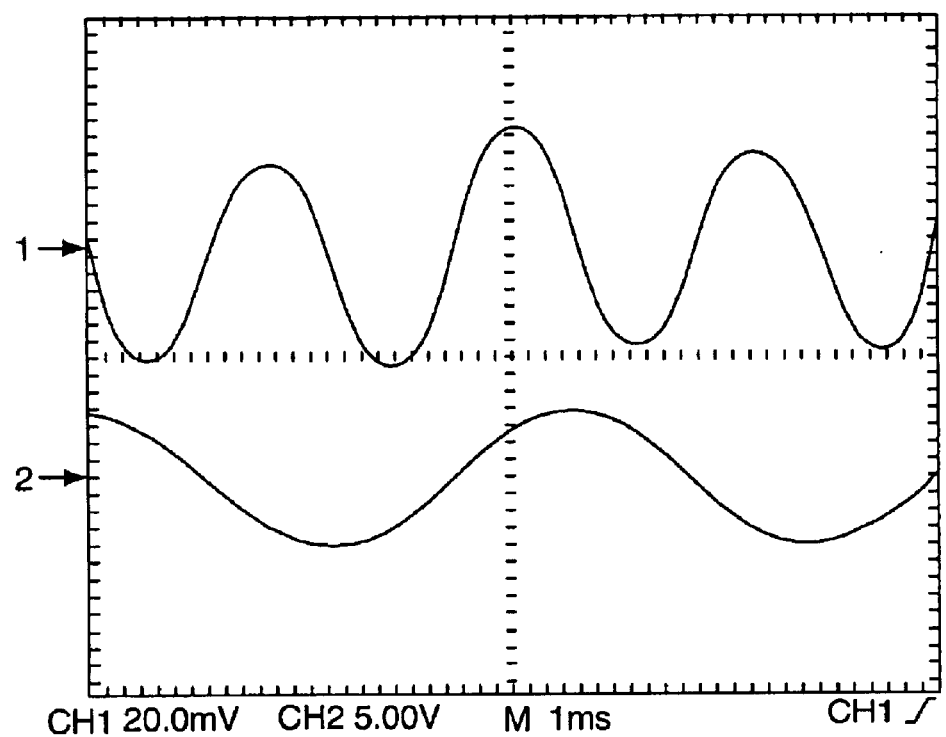
FIG. 9 shows the signal output (upper trace) of a structure-B sensor when an ac magnetic field (lower trace) is applied according to the invention.
Figure 10:
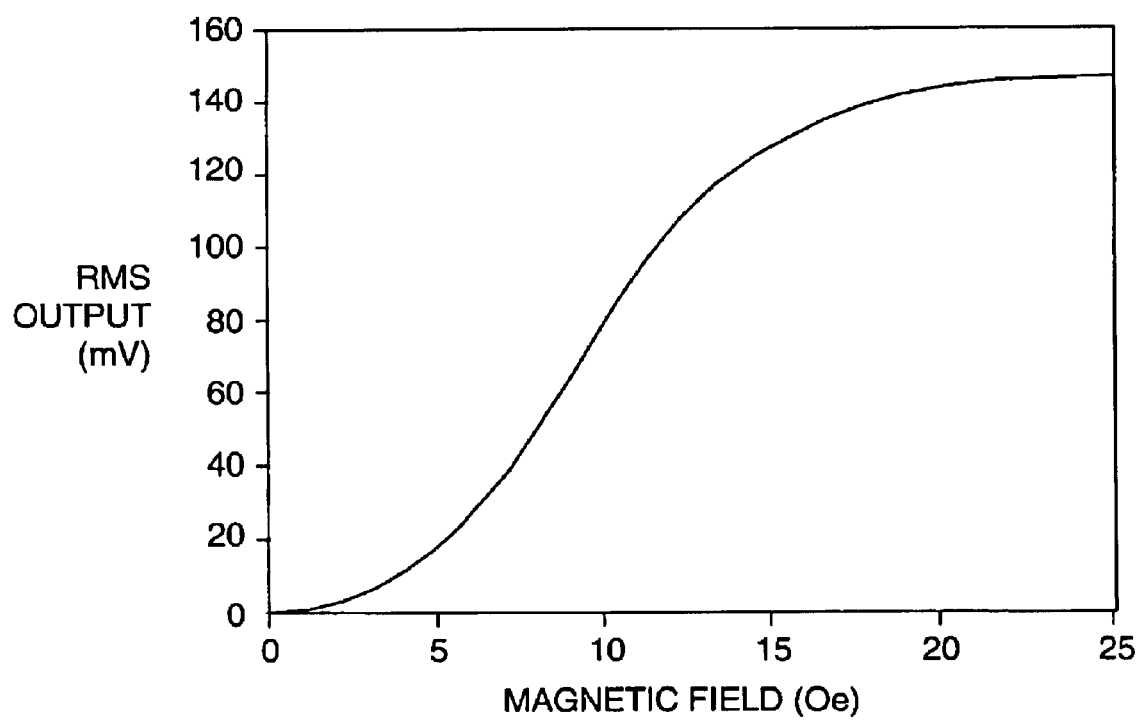
FIG. 10 shows the RMS of a signal output from a structure-B sensor as a function of the peak value of an ac magnetic field.
Figure 11:
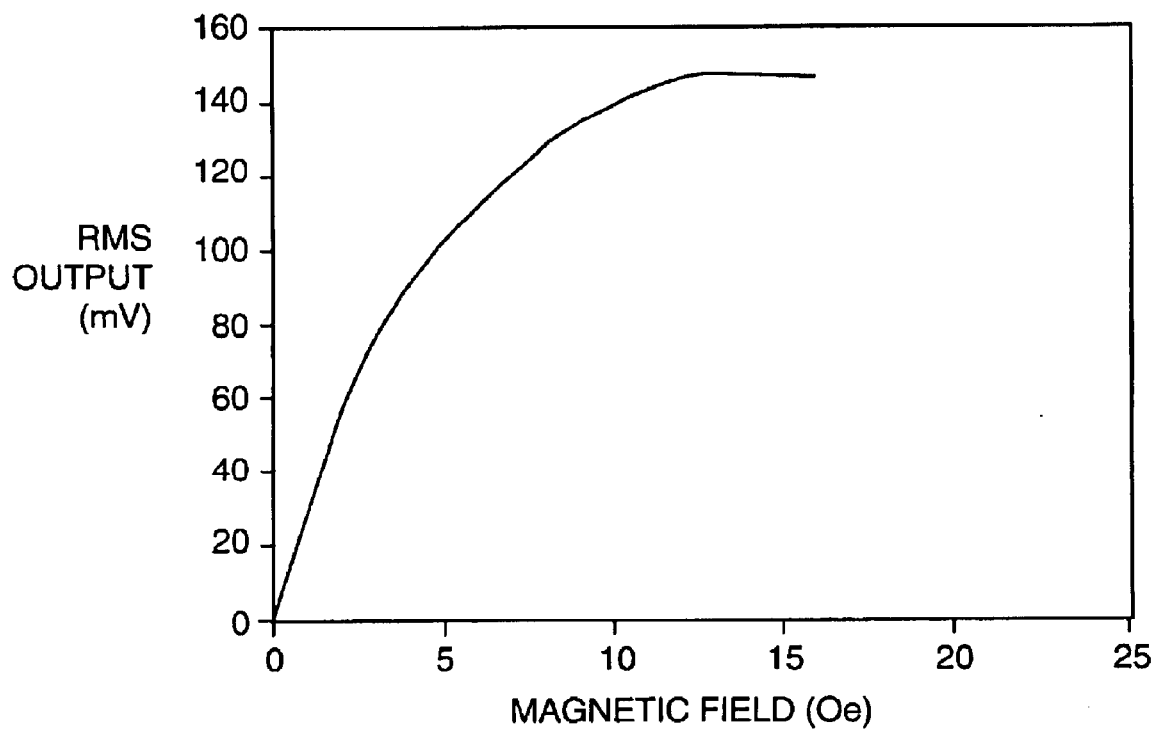
FIG. 11 shows the RMS of a signal output from a structure-B sensor biased at 12 Oe as a function of the peak value of an ac magnetic field.

A sample of piezoelectric lead zirconate titanate (PZT) ceramic sheet (2"×3"×150 $\mu$m) was first cut into one centimeter square pieces. A magnetic amorphous alloy (FeNiMoSiB) ribbon with a thickness of 30 $\mu$m was also cut into one-centimeter square. A sandwich structure B of FIG. 1 was made by gluing a magnetic alloy layer in the middle with two PZT layers outside using conducting silver epoxy. The two PZT layers were oriented with the same electric pole direction. Two electric leads were soldered to the sandwich, one on the top surface and one on the bottom surface as shown in FIG. 1b The sample was placed in an ac magnetic field and the two electrical leads were connected to an oscilloscope. FIG. 9 shows a response signal output (upper trace) with peak to peak signal of 90 mV. The ac magnetic field (lower trace) shows amplitude of 10 Gauss. The double frequency of the sensor output signal with respect to that of the magnetic field is due to the quadratic dependence of magnetostriction on magnetic field: $\lambda \sim \lambda_s (\cos^2 \theta - 1/3) \sim \lambda_s [(H/H_a)^2 - 1/3]$. The RMS output signal measured as a function of the magnetic field is shown in FIG. 9. The linear range of the output signal is from 5 to 15 Gauss and the signal is saturated when the field is over 25 Gauss. The magnetic field sensitivity of the sample over linear range is approximately 5 mV/Oe as calculated from the curve in FIG. 10. The same measurement was performed on the sample in the presence of a DC bias magnetic field of 12 Oe. The signal output now has the same frequency as the drive frequency of the magnetic field as long as the amplitude of the magnetic field is smaller than the bias magnetic field of 12 Oe. The RMS output signal is plotted as a function of the magnetic field in FIG. 11. A magnetic field sensitivity of 20 mV/Oe is obtained in this case.

EXAMPLE 2

Figure 12:
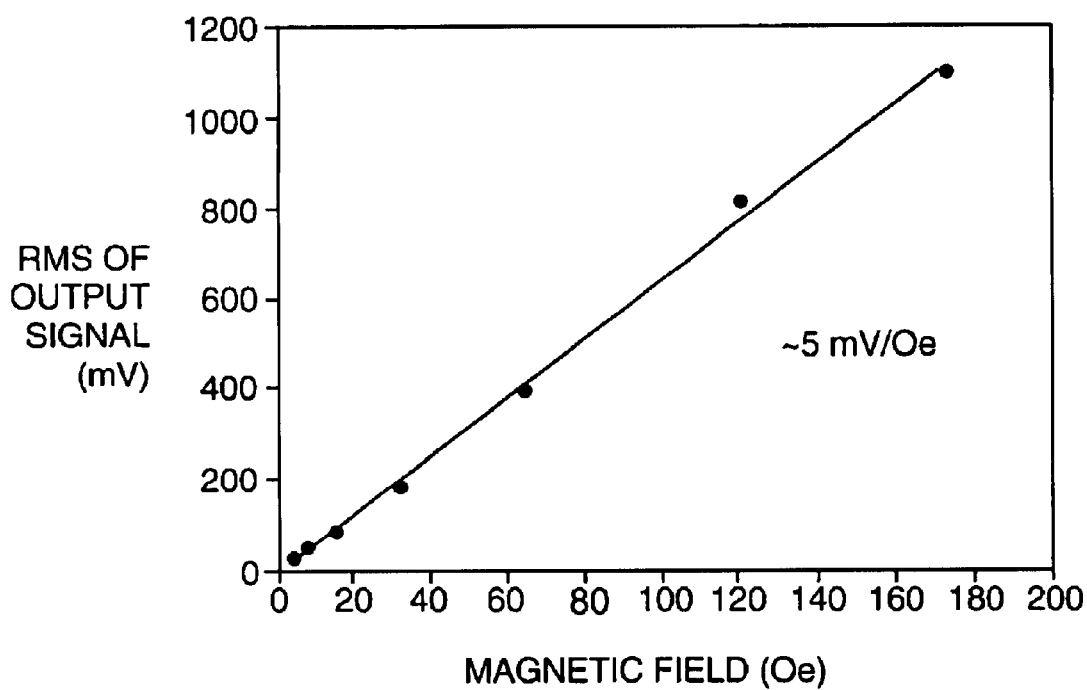
FIG. 12 RMS of a signal output from a structure-C sensor using Fe50Co50 as a function of the peak value of an ac magnetic field.

In this example two 3"×4"×50 $\mu$m $Fe_{50}Co_{50}$ sheets (as-rolled) and one 3"×4"×175 $\mu$m PZT plate were glued together to form the structure C as shown in FIG. 1 by a manufacturing process provided by Morgan Matroc, Inc. located at Bedford, Ohio. 200 pieces of 2 mm×10 mm sensors were made by dicing the 3"×4"glued wafer. The sensitivity of the selected samples was tested to show a good uniformity. Using a ⅛"×¼" NdFeB magnet placed at one end of the sensor serving as a bias magnetic field, these sensors have the sensitivity of 5 mV RMS signal per Oe and a large linear range as shown in FIG. 12.

EXAMPLE 3

Figure 13:
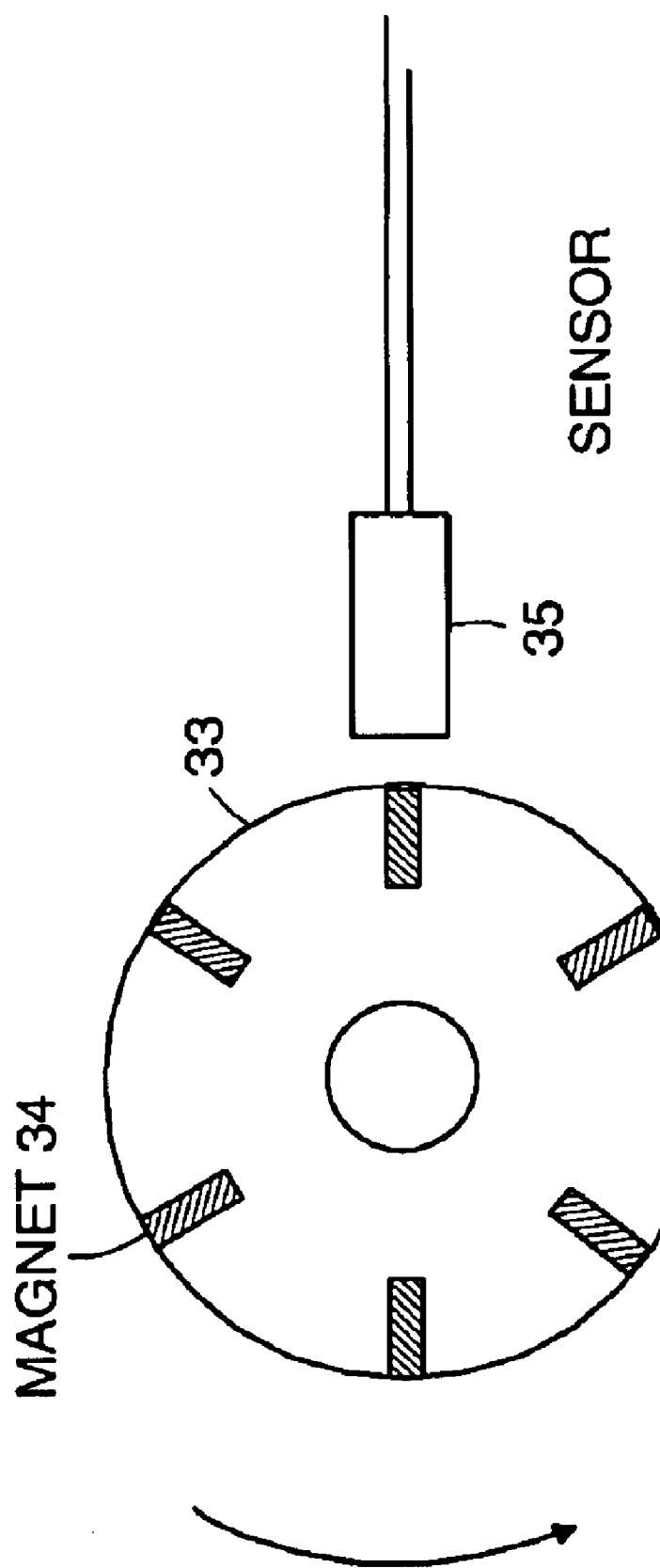
FIG. 13 shows the passive solid-state magnetic sensor used for detecting the rotating speed of a plate with six micro magnets mounted on the edge in equal distance according to the invention.
Figure 14B:
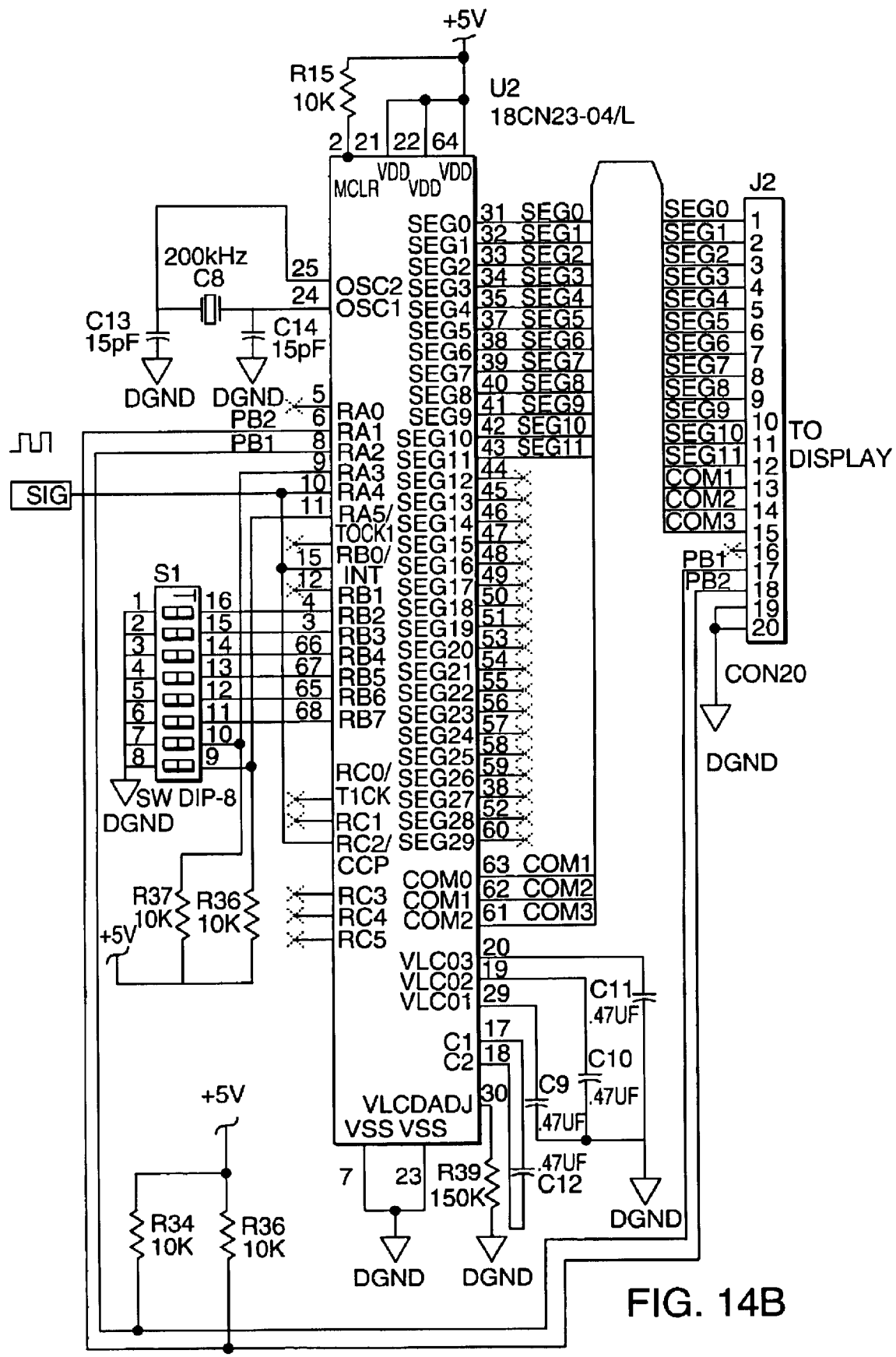
Figure 17:
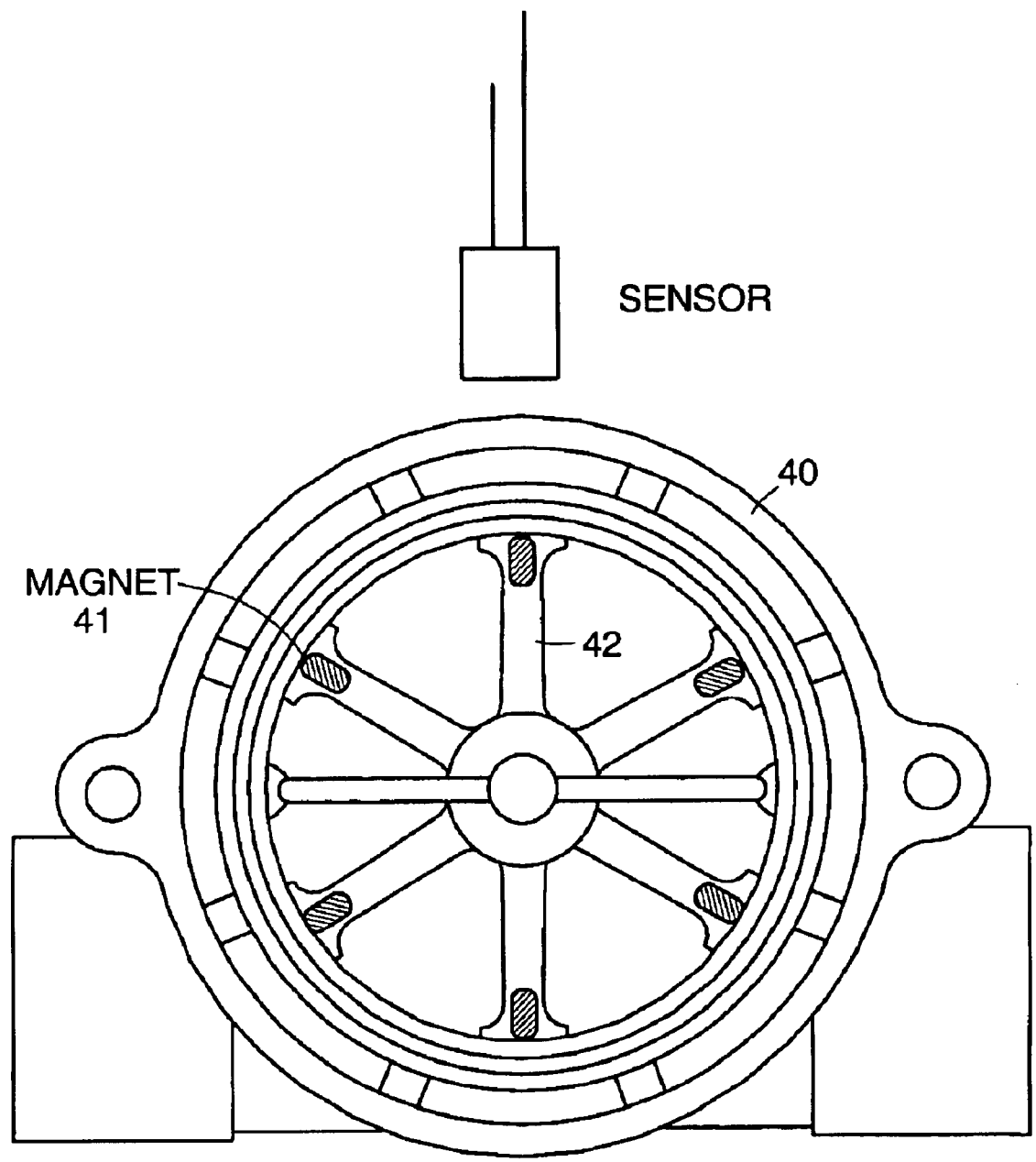
FIG. 17 is a schematic of the passive solid-state magnetic sensor used in metering liquid flow rates according to the invention.

One of the example-2 devices was used to demonstrate the detection of rotation speed. An aluminum plate 33 mounted with six micro NdFeB magnets 34 equally spaced at the edge, as shown in FIG. 13, was driven with a DC motor. A sine-wave magnetic field generated by this rotating aluminum plate was then detected by the sensor 35 with an electrical sine-wave signal output. An electrical circuit, including impedance matching, signal amplifying, pulse counting and displaying, was designed for the sensor and tachometer as shown in FIGS. 14a and 14b. A square-wave pulse signal was measured from the circuit output. The number of the pulses was then counted within a minute, converted to the speed of the motor rotation, and displayed on the liquid crystal screen by the circuit. A software used in a microprocessor was also developed to calculate the time between the pulses and then to convert it to the frequency or revolution per minute (RPM). This approach eliminates the necessity of using sixty teeth gear for achieving resolution of one RPM. With this developed software we have built a tachometer which can read the speed from a wheel having only one magnet (one pulse per resolution) with a resolution of one RPM. In this configuration the sensor can be placed as far as 15 mm away from the rotating aluminum plate. We have also designed the sensor 36 for ferromagnetic gears 37 which are commonly used in the industry as shown in FIG. 15. A bias magnetic field was applied by placing a 1 cm-diameter ferrite permanent magnet 38 in contact with the long side of a rectangular example-2 device 39. A commercial 24 pitch ferromagnetic gear was used. A schematic of magnetic field inside the sensor when it pass tip and valley of the gear is shown in FIG. 16. Although the sensor has to be placed within 5 mm gap to the gear, an electrical pulse signal was clearly detected and converted to the speed of the rotation by the same electrical circuit as shown in FIG. 14.

EXAMPLE 4

Figure 18:
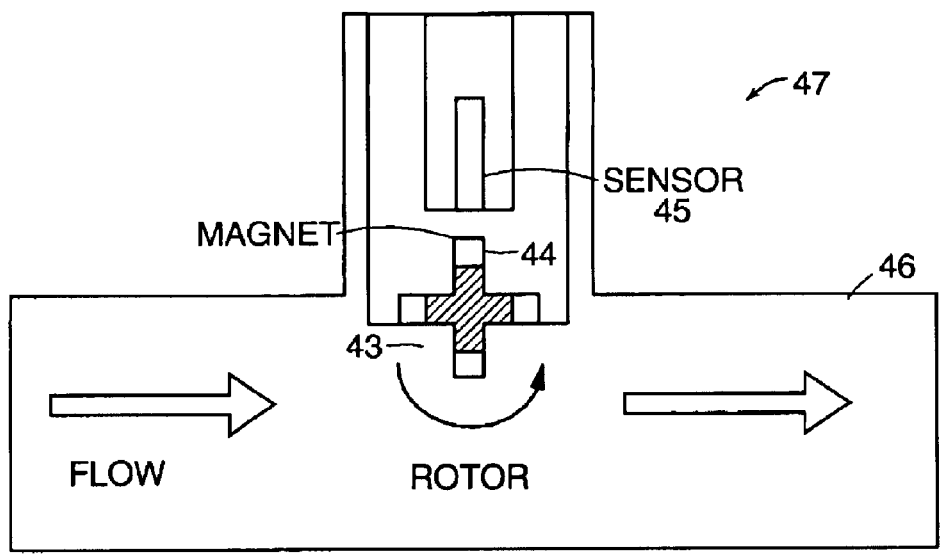
FIG. 18 is a schematic of flow sensor designed in use with Swedgelock and PVC fittings according to the invention.
Figure 19:
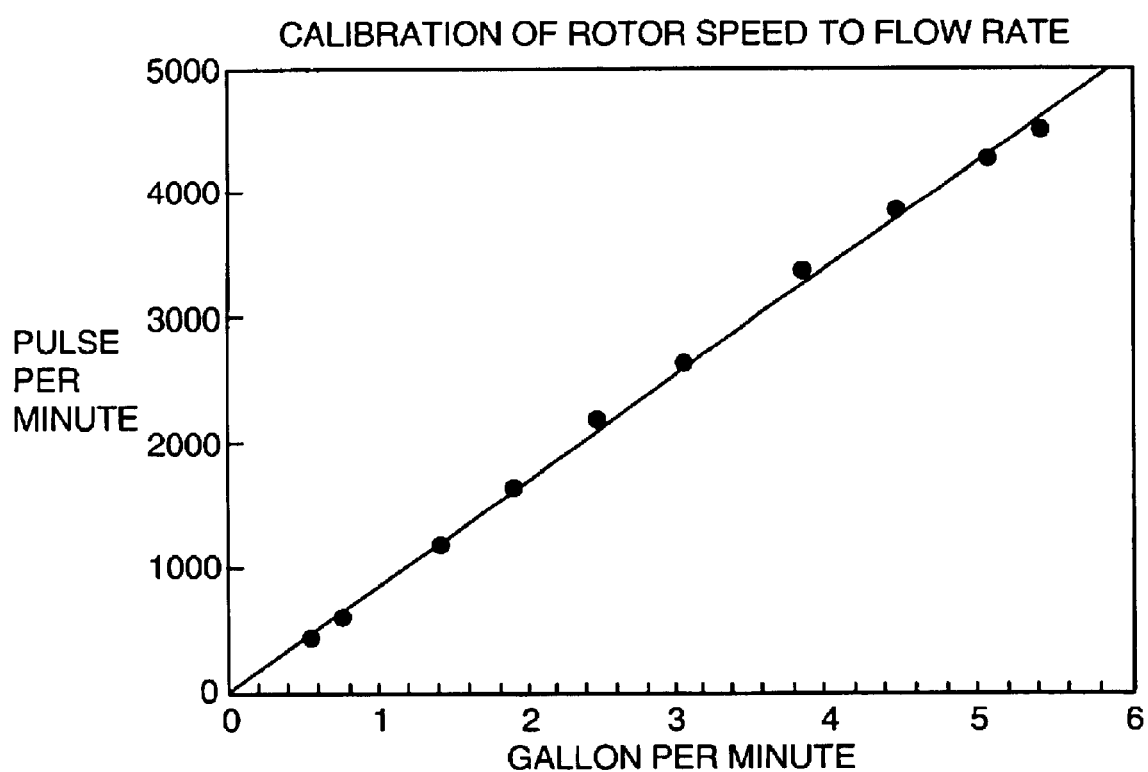
FIG. 19 shows rotor speed measured as a function of liquid flow rate by the flow sensor showed in FIG. 18.

One of the example 2-sensors was also demonstrated for the application of measuring liquid flow rate. In this example a commercial water flow indicator 40 was purchased and six micromagnets 41 was placed on the tips of each blade 42 as shown in FIG. 16. An magnetic sensor was attached to the outside of the flow indicator. The water flow rate was then measured as a function of the rotation speed of the blade inside the flow indicator. The calibration and the conversion of the flow rate unit was easily achieved by a microprocessor used in the electrical circuit shown in FIG. 14. We have also designed a flow sensor to fit the popular pipe fittings such as Swedglock Brass Tee and PVC Tee as shown in FIG. 18. A rotor 43 with four miro NdFeB magnets 44 mounted on four blades, respectively, are moving freely at the bottom of the flow sensor 46. A flow sensor was sealed inside the Tee 47 at the optimized height which gives the maximum rotation speed at a certain flow rate. FIG. 19 shows a linear relationship between rotor speed and the liquid flow rate.

EXAMPLE 5

Figure 20:
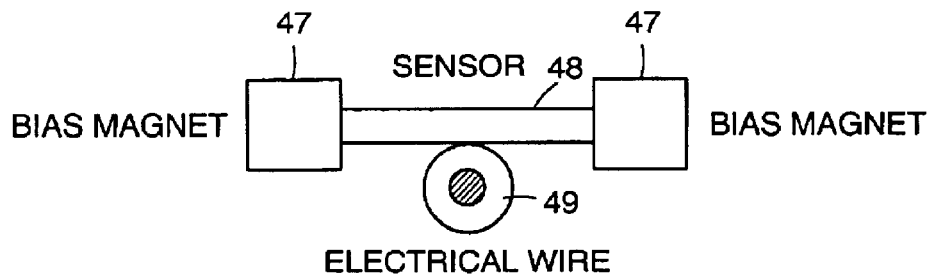
FIG. 20 is a schematic of the passive solid-state magnetic sensor used for electrical current measurement according to the invention.
Figure 21:
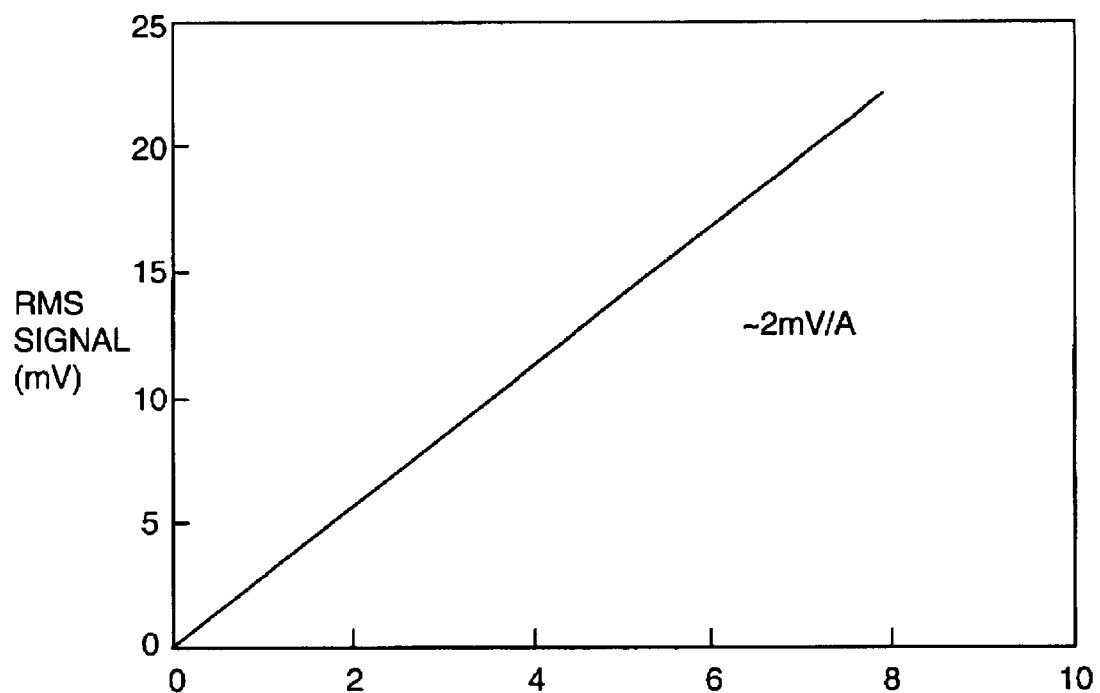
FIG. 21 shows the highly linear correspondence of piezoelectric signal output to electrical current measured by the electrical current sensor showed in FIG. 20.
Figure 22:
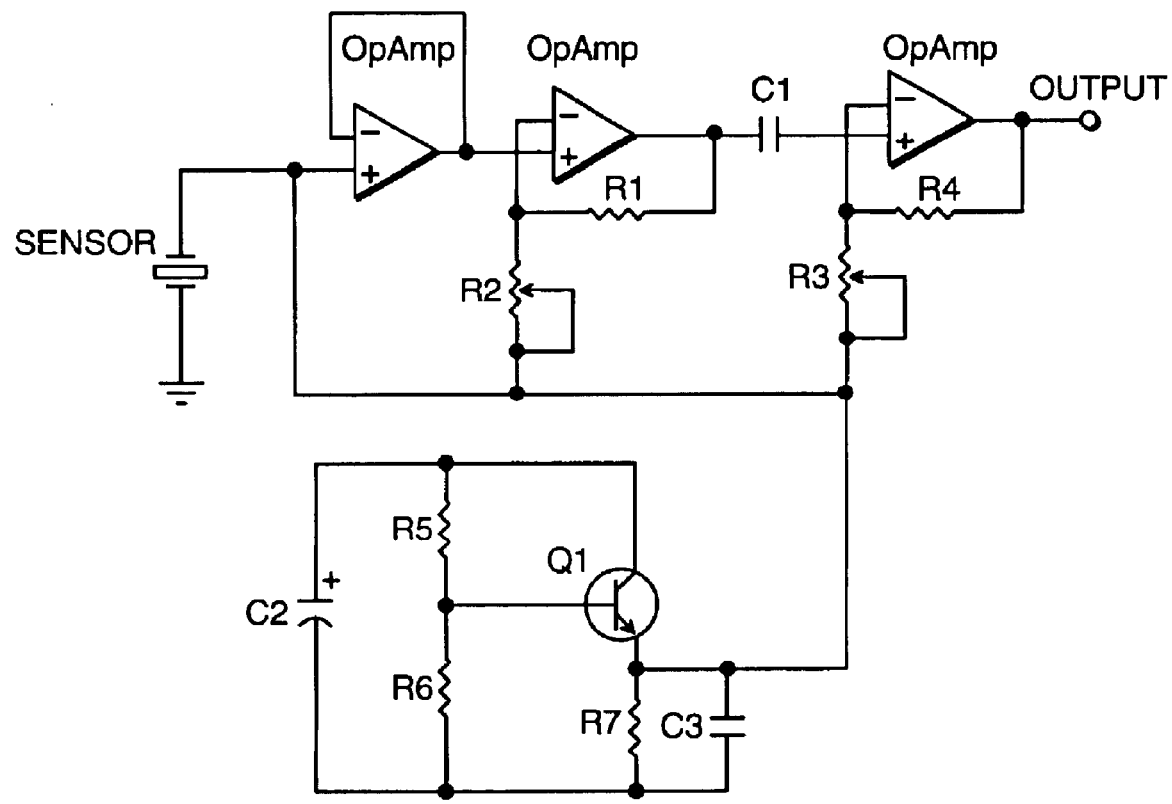
FIG. 22 is a schematic of an electrical circuit design for the passive solid-state magnetic sensors used in the electrical current measurement according to the invention.

One of the example-2 sensors was also demonstrated for measuring ac electrical current. Two bias magnets 47 were placed at each end of the sensor 48 as shown in FIG. 20. The experiment was performed by placing a sensor on top of electrical wire 49 carrying a current from 1 to 10 A, and a raw signal was measured by an oscilloscope. The result plotted in FIG. 21 shows a linear relationship between the RMS signal and the current. The sensitivity is as large as 2 mV/A without amplification. The improvement of one order of magnitude higher sensitivity can be achieved by optimizing the material properties and the geometrical design. The linear fitting curve passing the origin point shown in the figure indicates the characteristic of the non zero-offset voltage for this current sensor in comparison with zero-offset voltage in the case of Hall effect and GMR current sensors. This advantage will lead to a simpler design of precision current sensors. A large dynamic range of the measurement is ready to be achieved by selecting the magnetic materials and designing the sensors. FIG. 22 is a circuit design for electrical current sensors, which will amplifying the detecting signal to a nominal voltage signal such as 1 V/A by adjusting the gains of the circuit. While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A magnetic field sensor comprising a magnetostrictive material in contact with a piezoelectric material, the magnetostrictive material straining in response to a magnetic field and imparting stress to the piezoelectric material to produce a detectable voltage signal, the magnetic field sensor comprising at least one rod or fiber of a first one of the magnetostrictive and piezoelectric materials, and a matrix of the second one of the magnetostrictive and piezoelectric material surrounding the at least one rod or fiber.

2. The magnetic field sensor of claim 1, wherein the sensor comprises a matrix of magnetostrictive material that strains under the influence of a magnetic field and imparts stress to at least one rod or fiber of piezoelectric material that is surrounded by the matrix to produce a detectable voltage.

3. The magnetic field sensor of claim 2, wherein a plurality of piezoelectric material rods or fibers are connected electronically in parallel.

4. The magnetic field sensor of claim 2, wherein each one of a plurality of piezoelectric material rods or fibers is connected to an associated read-out circuit.

5. The magnetic field sensor of claim 2, wherein a single piezoelectric rod or fiber is surrounded by a magnetostrictive matrix material.

6. The magnetic field sensor of claim 1, wherein the sensor comprises at least one rod or fiber of magnetostrictive material that strains under the influence of a magnetic field and imparts stress to a matrix of piezoelectric material surrounding the at least one rod or fiber to produce a detectable voltage.

7. The magnetic field sensor of claim 6, wherein a single magnetostrictive rod or fiber is surrounded by a piezoelectric matrix material.

* * * * *